United States Patent [19]
Bauer et al.

[11] Patent Number: 6,097,637
[45] Date of Patent: Aug. 1, 2000

[54] DYNAMIC SINGLE BIT PER CELL TO MULTIPLE BIT PER CELL MEMORY

[75] Inventors: Mark E. Bauer, Cameron Park; Sanjay S. Talreja, Folsom; Phillip Mu-Lee Kwong, Folsom; Duane R. Mills, Folsom; Rodney R. Rozman, Placerville, all of Calif.

[73] Assignee: Intel Corporation, Santa Clara, Calif.

[21] Appl. No.: 08/707,028

[22] Filed: Sep. 10, 1996

Related U.S. Application Data

[63] Continuation of application No. 08/558,947, Nov. 13, 1995, abandoned, which is a continuation of application No. 08/252,686, Jun. 2, 1994, abandoned.

[51] Int. Cl.[7] .................................................. G11C 16/04
[52] U.S. Cl. ............................. 365/185.24; 365/168
[58] Field of Search ............................ 365/168, 184, 365/185.18, 185.19, 104, 230.04, 185.24

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,771,404 | 9/1988 | Mano et al. | 365/189 |
| 5,012,448 | 4/1991 | Matsuoka et al. | 365/208 |
| 5,043,940 | 8/1991 | Harari | 365/168 |
| 5,163,021 | 11/1992 | Mehrotra | 365/185 |
| 5,172,338 | 12/1992 | Mehrotra | 365/185 |
| 5,297,148 | 3/1994 | Harari | 371/10.2 |
| 5,351,210 | 9/1994 | Saito | 365/189 |
| 5,355,464 | 10/1994 | Fandrich et al. | 395/425 |
| 5,515,317 | 5/1996 | Wells et al. | 395/427 |

*Primary Examiner*—A. Zarabian
*Attorney, Agent, or Firm*—Blakely, Sokoloff, Taylor & Zafman LLP

[57] ABSTRACT

A memory system having memory cells for storing one of a plurality of threshold levels to store more than a single bit per cell is disclosed. The memory system contains a switch control to permit selection of an operating mode including a multi-level cell mode and a standard cell mode. The memory system further includes a reading circuit to read a single bit per cell when operating in the standard cell mode, and to read multiple bits of data per memory cell when operating in the multi-level cell mode. A program circuit programs a single bit of data per memory cell for addressed memory cells when operating in the standard cell mode, and programs multiple bits of data per memory cell for addressed memory cells when operating in the multi-level cell mode.

12 Claims, 7 Drawing Sheets

DYNAMIC SINGLE BIT PER CELL TO MULTIPLE BIT PER CELL MEMORY

This is a continuation of application Ser. No. 08/558,947, filed Nov. 13, 1995, now abandoned, which is a continuation of application Ser. No. 08/252,686, filed Jun. 2, 1994 abandoned.

FIELD OF THE INVENTION

The present invention relates to storing data in a memory device, and more specifically to a dynamically switchable single bit per cell to multiple bit per cell memory system.

BACKGROUND OF THE INVENTION

Memory devices have numerous applications for storing data. Some memory devices store a specific state by altering characteristics pertaining to the threshold of conduction of the device. Typically, in order to program data into the memory device, the threshold of conduction for the memory device is configured such that the conduction of current represents a first state and the non-conduction of current represents a second state. However, such a memory device is configurable to store a range of threshold levels, thereby permitting storage of analog data. The storing of analog data permits storage of multiple bits of data in a single memory cell. This is known as a multi-level cell.

There are prior patents that discuss multi-level storage. U.S. Pat. No. 5,043,940 of Harrari for Flash EEPROM Memory Systems Having Multistate Storage Cells ("Harrari") defines multi-level states in terms of the threshold voltage $V_t$ of a split-channel flash electrically erasable read only memory (EEPROM) memory cell. Using these four states, Harrari is able to store two bits of data per memory cell by applying multiple programming pulses to each memory cell. U.S. Pat. No. 5,163,021 of Mehrota et al. for Multi-State EEPROM Read And Write Circuits And Techniques ("Mehrota") also describes multilevel memory system. Like Harrari, Mehrota defines four states in terms of memory cell threshold voltage.

However, when storing more than a single bit per cell, the reliability of the memory system is diminished. Therefore, it is desirable to increase the reliability of a memory system capable of storing more than a single bit per cell. The integrity of data storage for some types of data may be increased through the use of error correctional coding. However, other types of data, such as code, is more difficult to encode for operation with an error correction system. Because the integrity of data storage is more critical for some types of data than for others, it is desirable to store some types of data in a low density memory while storing other types of data in a high density memory.

SUMMARY AND OBJECTS OF THE INVENTION

Therefore, it is an object of the present invention to store more than a single bit per flash memory cell.

It is another object of the present invention to permit a user to store more than a single bit per cell in portions of a memory while storing a single bit per cell in other portions of the memory.

It is a further object of the present invention to implement a memory system that dynamically switches from storing a single bit per cell to storing multiple bits per cell.

These and other objects are realized in a memory system having a plurality of memory cells for storing one of a plurality of threshold levels in the memory cells. The threshold levels demarcate $2^n$ number of windows for designating states to represent storage of "n" bits of data for the memory cells. The memory system also contains a switch control to permit selection of an operating mode for the memory system including a multi-level cell mode and a standard cell mode. The memory system further includes a reading circuit to read a single bit per cell when operating in the standard cell mode, and to read multiple bits of data per memory cell when operating in the multi-level cell mode.

In order to program the memory cells, the memory system contains a program controller. The program controller programs a single bit of data per memory cell for addressed memory cells when the switch control indicates selection of the standard cell mode, and programs multiple bits of data per memory cell for addressed memory cells when the switch control indicates selection of the multi-level cell mode. A program aligner selectively programs a portion of addressed memory cells to accommodate storing multiple bits per cell when the switch control indicates selection of the multi-level cell mode, and selectively programs the addressed memory cells when the switch control indicates selection of the standard cell mode. The program circuit also includes verify logic coupled to the reading circuit for comparing the threshold levels stored in the addressed memory cells to desired data. The verify logic identifies memory cells that require additional programming.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

The present invention includes a memory system that is dynamically switchable between a standard cell mode and a multi-level cell (MLC) mode. When operating in the MLC mode, the memory system stores multiple bits per cell. The memory system stores a single bit per cell when operating in the standard cell mode. In one embodiment, the multi-level memory of the present invention stores two bits per cell when operating in the MLC mode. The present invention permits dynamic switching between storing a single bit per cell in portions of the memory and storing multiple bits per cell in other portions of the memory.

Although the present invention is described in conjunction with a memory system storing two bits per cell, any number of bits per cell may be stored in a single cell by increasing the number of threshold levels without deviating from the spirit and scope of the present invention. The memory system of the present invention is described in conjunction with a memory system that is dynamically switchable between a standard cell mode and a multi-level cell (MLC) mode. In addition, a memory system that is dynamically switchable among a plurality of storage modes, such as storing 1 bit per cell, 1.5 bits per cell, 2 bits per cell, etc., may be used without deviating from the spirit and scope of the invention.

The ability to switch between storing a single bit per cell and multiple bits per cell within a single memory has many applications. For example, the dynamic single bit per cell to multiple bit per cell memory permits the ability to manufacture one device that offers at least two densities. In addition, the dynamic single bit per cell to multiple bit per cell memory has use in mass storage applications. For example, if storing data in multiple bits per cell exhibits a lower read and write reliability, then a balance is struck between reliability and density.

Figure 1:
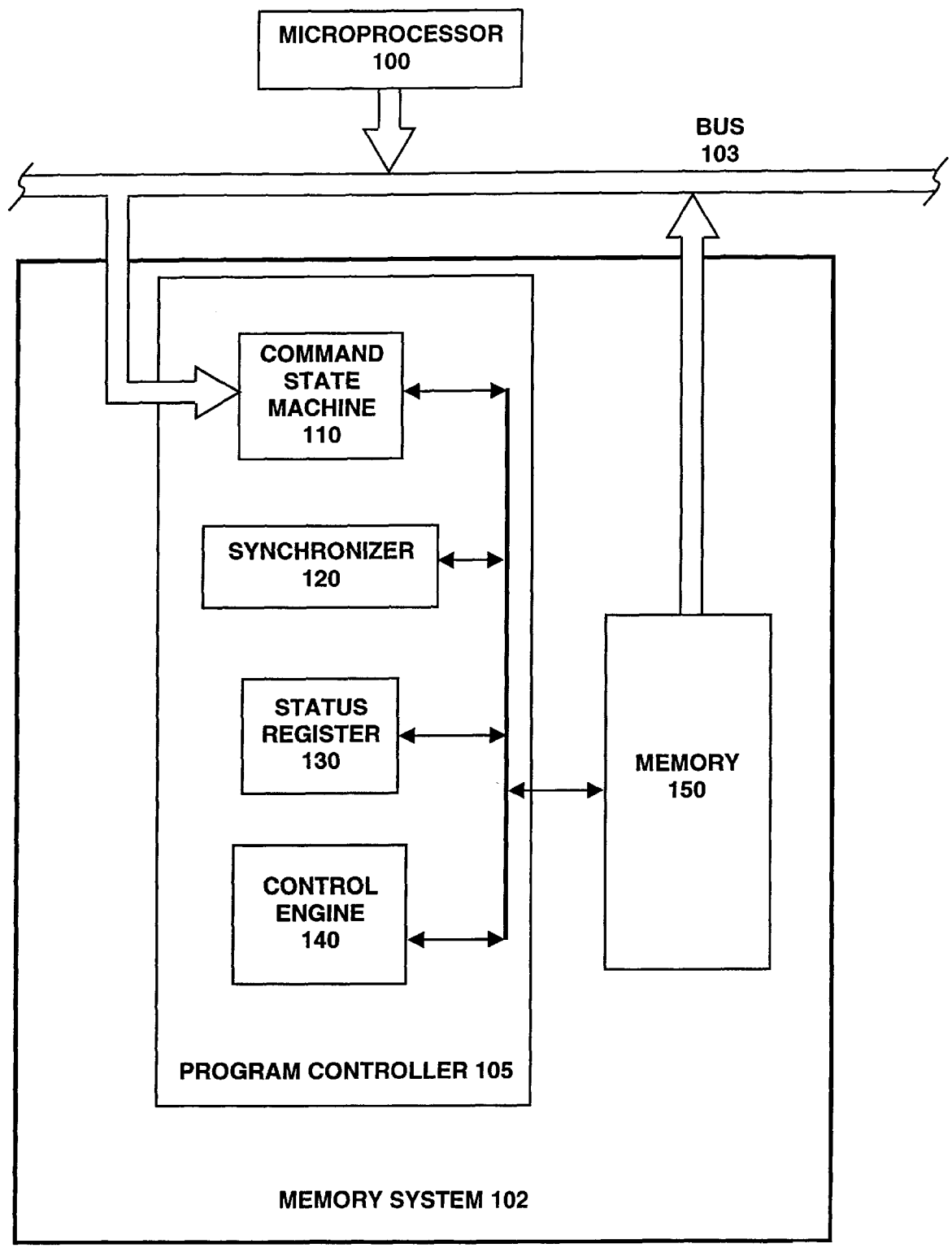
FIG. 1 is a high level block diagram illustrating a memory system and microprocessor.

FIG. 1 illustrates a system block diagram configured in accordance with one embodiment of the present invention. The dynamically switchable memory system has application for use in any system utilizing a multi-level memory, such a computer system. A portion of such a computer system including a microprocessor 100, bus 103 and memory system 102 is shown in FIG. 1. A memory system 102 contains a program controller 105 and a memory 150. The microprocessor 100 coupled, via the bus 103, to the program controller 105. The program controller 105 provides the necessary operations to control the memory 150. In one embodiment, the program controller 105 and memory 150 are located on a single integrated circuit die. The program controller 105 contains a command state machine 110, synchronizer 120, status register 130 and a control engine 140. The operations of the program controller 105 may be executed by the microprocessor 100. The memory 150 contains the memory array as will be described more fully below.

In operation, the microprocessor 100 generates commands to program, erase and read the cells within the memory 150. Through use of the command structure, the microprocessor 100 specifies the type of operation (e.g. read, program/verify, erase/verify), an address specifying the memory cells for the operation, and data for a program/verify operation. The command state machine 110 receives the commands from the microprocessor 100. For a write or program operation, the command state machine 110 directs the control engine 140 to execute a program/verify operation in the memory 150. For a read operation, the command state machine 110 provides the necessary address and control information to the memory 150.

In one embodiment, the control engine 140 comprises a microcontroller that executes micro code stored in a memory. The control engine 140 generates the necessary timing, control, data and addresses for a program/verify operation to the memory 150. The synchronizer 120 permits asynchronous or synchronous operation of the memory 150 with the microprocessor 100. The status register 130 stores status information pertaining to the memory system 102. For a further description of an on-chip program controller, such as program controller 105, see U.S. patent application Ser. No. 07/655,650, filed Feb. 11, 1991, entitled Flash Memory Erase Suspend and Resume, inventor Fandrich.

The present invention has application for use in a memory system capable of storing more than a single bit of information in each cell. In one embodiment, the cells of the memory device are constructed as flash electrical erasable programmable read only memory (flash EEPROM) cells. Although the present invention is described in conjunction with flash EEPROM cells, other cells, such as read only memory (ROM), erasable programmable read only memory (EPROM), conventional electrical erasable programmable read only memory (EEPROM), or dynamic random access memory (DRAM) may be substituted without deviating from the spirit and scope of the invention.

The flash EEPROM memory device is organized in sectors of EEPROM cells, wherein a particular sector is programmed and erased simultaneously. The flash EEPROM devices are non-volatile memory devices such that once programmed by a user, the EEPROM cells retain the state programmed until erased. In one embodiment, the flash EEPROM cells consist of a single transistor having a select gate, a floating gate, a source, and a drain. The source and drain reside on the substrate, and the substrate is grounded. The floating gate is insulated from the select gate and the channel region of the cell by a non-conductive oxide to permit retention of charge on the floating gate.

The flash EEPROM memory cell is turned on and off by the absence or presence of charge on the floating gate. During programming, the electrons are placed on the floating gate, and are trapped by surrounding non-conductive oxide. If electrons reside on the floating gate, the field effect generated by the excess electrons results in a high threshold of conductivity for the memory cell. When a voltage is applied to the select gate of such a memory cell, the memory cell is turned off, thereby storing a first logic state. When no excess electrons are trapped on the floating gate, however, the memory cell exhibits a lower threshold of conduction, and the memory cell conducts current to represent a different logic state.

The floating gate can retain a range of charges, and therefore the memory cell can be programmed to exhibit multiple thresholds of conduction or multiple threshold levels ($V_t$). By storing multiple thresholds levels on the floating gate of the cell, the memory cell may be programmed to store more than a single bit. In order to discern the multiple threshold levels, the memory system designates threshold windows. Each threshold window specifies a memory state of the cell. The multiple threshold levels demarcate $2^n$ number of windows for designating states to represent storage of "n" bits of data for the memory cells. The present invention is described in conjunction with a memory cell capable of storing four states to represent two bits. However, the present invention applies to a memory cells storing three or more states.

In order to read the state stored in an addressed flash EEPROM memory cell, an operating voltage is placed across the source and drain, and on the control gate to address the cell. The state of the addressed cell is measured by detecting the level of current flowing between the source and drain. The level of current flowing between the source and drain is proportional to the threshold level of the addressed EEPROM memory cell. The level of current flowing from the addressed cell is compared against a reference current generated from a reference cell. In one embodiment, the reference cell is also an EEPROM cell, and the cell is one time programmable to a proper threshold of conduction. A sensing scheme for the memory 150 is described more fully below.

As discussed above, a flash EEPROM memory cell, as well as other types of memory cells, is configurable to store multiple threshold levels ($V_t$). In a memory cell capable of storing two bits per cell, four threshold levels ($V_t$) are required. Consequently, two bits are designated for each threshold level. Table 1 illustrates logic level designations for four threshold levels ($V_t$) configured in accordance with one embodiment of the present invention.

TABLE 1

| | Logic Level | |
|---|---|---|
| $V_t$ Levels | $Bit_1$ | $Bit_0$ |
| Level 0 | 0 | 0 |
| Level 1 | 1 | 0 |
| Level 2 | 0 | 1 |
| Level 3 | 1 | 1 |

For the threshold levels shown in Table 1, level 0 is the highest threshold level, and level 3 is the lowest threshold level. Although the present invention is described in conjunction with the logic level designations for the threshold levels ($V_t$) as set forth in Table 1, other logic level designations for the $V_t$ threshold levels may be used without deviating from the spirit or scope of the invention.

Figure 2:
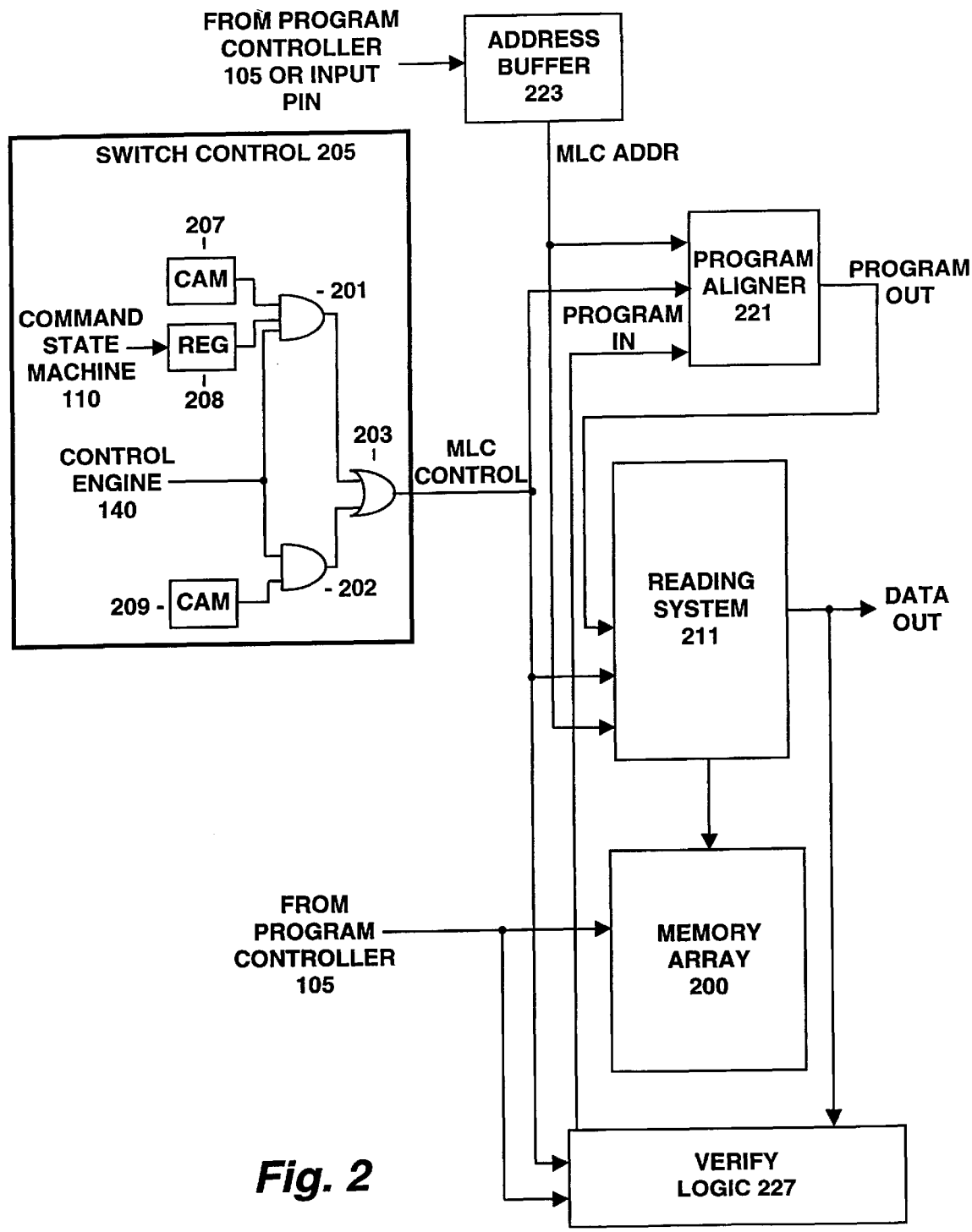
FIG. 2 is a high level block diagram illustrating one embodiment of the memory system of the present invention.

FIG. 2 is a high level block diagram illustrating one embodiment of the memory 150. The memory 150 includes a switch control 205 for switching between operation in the MLC mode and the standard cell mode. The memory 150 contains a reading system 211, and a memory array 200. The reading system 211 receives both a buffered MLC addr and the MLC control signals to permit reading in both modes. The reading system 211 contains array loads 210 (FIG. 3) and sensing system 220 (FIG. 4). The memory array 200, coupled to the reading system 211, contains the memory cells for storing data. In order to program and erase the memory cells, the memory 150 further includes a program circuit comprising verify logic 227 and program aligner 221. The verify logic 227 receives data from the reading system 211, and generates "program in" data for input to the program aligner 221. In turn, the program aligner 221 generates "program out" data to selectively program memory cells in the memory array 200.

The memory 150 further includes an address buffer 223 for storing a multi-level cell address (MLC addr). In one embodiment, the MLC addr is received from an input pin on the memory system 102. In an alternative embodiment, the MLC addr is input to the address buffer 223 from the program controller 105. In the alternative embodiment, the MLC addr is specified in a command when the memory is operating in the MLC mode.

In general, the control switch 205 generates an active MLC control signal to indicate that the memory 150 is operating in the MLC mode. In one embodiment, the switch control 205 contains CAM fuse cells 207 and 209. The CAM cells 207 and 209 are factory programmable. When the CAM cell 209 is programmed or blown, the memory 150 is configured to operate in the MLC mode. The programming of CAM cell 207 permits switching of the memory 150 between the MLC mode and the standard mode via a command. A register 208, coupled to the command state machine 110, permits selection between the MLC mode and the standard cell mode through the command control interface.

The switch control 205 also contains AND gates 201, 202, and an OR gate 203. The control engine 140 is coupled to the AND gates 201 and 202 to permit the control engine 140 to override the current selection of the operating mode stored in the register 208. The ability for the control engine 140 to control selection of the MLC and standard cell modes is useful in both testing and system applications. For example, during an erase operation, all cells in an erase block are erased to a common state. The control engine 140 may operate more efficiently on cell levels than on a bit basis. Consequently, the switch control 205 generates a MLC control signal via the command state machine 110 or control engine 140 to select operation of the MLC mode or the standard cell mode.

Because the memory circuit of the present invention permits operation in both the MLC and the standard cell modes, an addressing scheme to access the memory in both modes is required. In one embodiment, the addressing scheme maintains address coherency between operation in the MLC and standard cell modes. For a memory system capable of storing two bits per cell, an extra address, entitled the multi-level cell address (MLC addr), is provided to access the additional memory locations generated by storing more than a single bit per cell. In the standard cell mode, each address identifies a unique word in the memory array 200. In the MLC mode, the same address identifies the same word in the memory array 200 as when operating in the standard cell mode. However, in the MLC mode, the MLC address identifies half of the cells that store the same amount of data.

If a memory system stores two bits per cell when operating in the MLC mode, then the memory system stores twice the data when operating in the MLC mode than when operating in the standard cell mode. For example, a memory array operating in the standard cell mode that stores 16 bit words requires 16 cells to store the 16 bit word. For the same memory array operating in the MLC mode and storing two bits per cell, only 8 cells are required to store the same 16 bit word. Therefore, if a single address identifies the 16 bit word when operating in the standard cell mode, then an additional address bit is required when operating in the MLC mode to identify which of the 8 cells store the 16 bits. The operation of selecting cells within a wordline for operation in the MLC mode is described more fully below.

By utilizing the MLC address to select 8 cells within the 16 cells addressable by the standard addressing mode, address coherency is maintained between the multi-level cell mode and standard modes. In a first embodiment, the MLC address is provided through an additional pin on the program controller 105. In a second embodiment, the MLC address is received from the program controller 105 via a command. For a further description of addressing for a memory device capable of operating in both a MLC and standard modes, see U.S. patent application Ser. No. 08/252,920, inventors: Stephen E. Wells, et al., and entitled Addressing Modes for a Dynamic Single Bit Per Cell to Multiple Bit Per Cell Memory, filed concurrently with the present application, and assigned to assignee of the present invention, Intel Corporation, Santa Clara, Calif.

Figure 3:
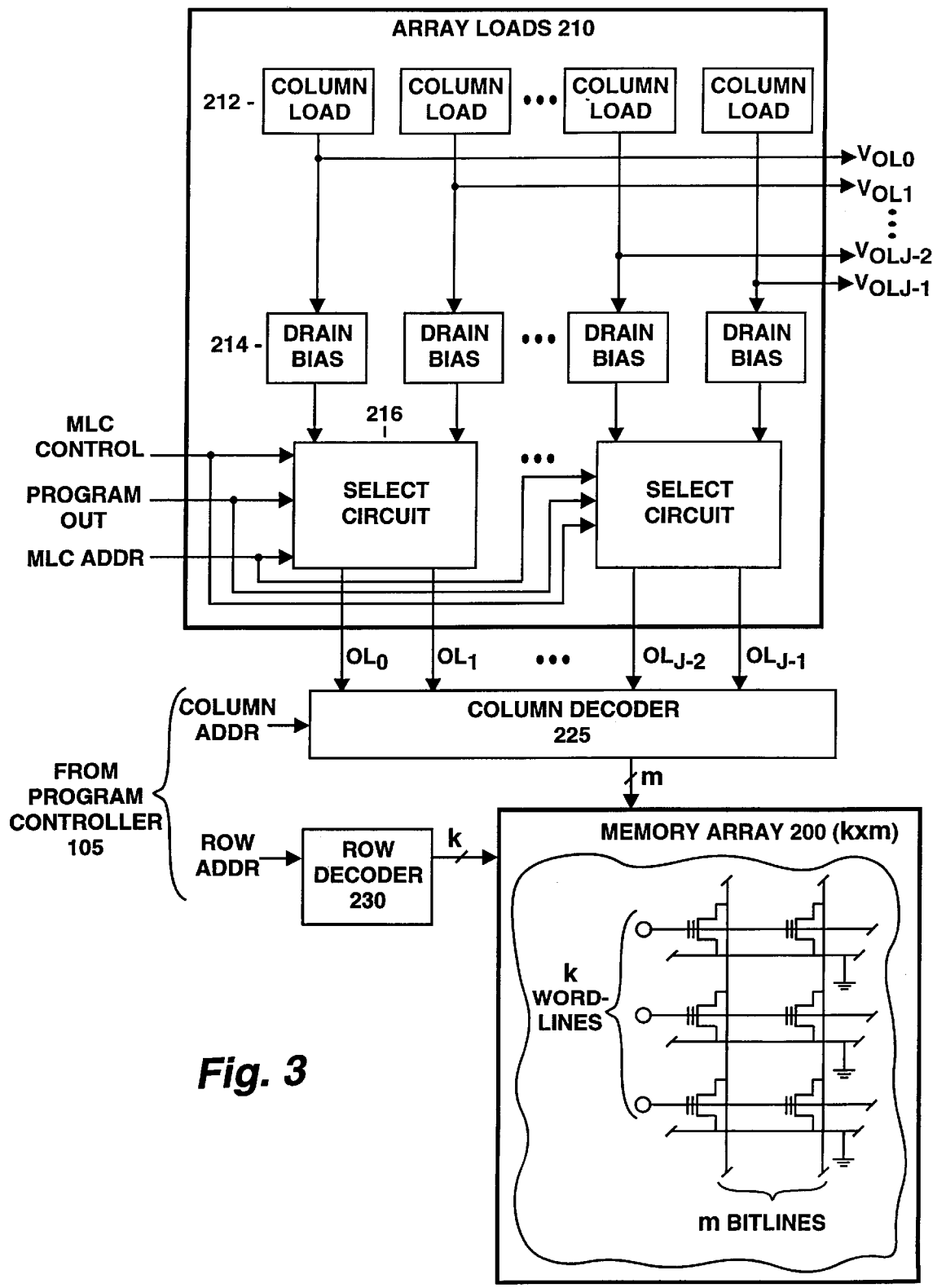
FIG. 3 illustrates an array load and memory array configured in accordance with one embodiment of the memory system.
Figure 4:
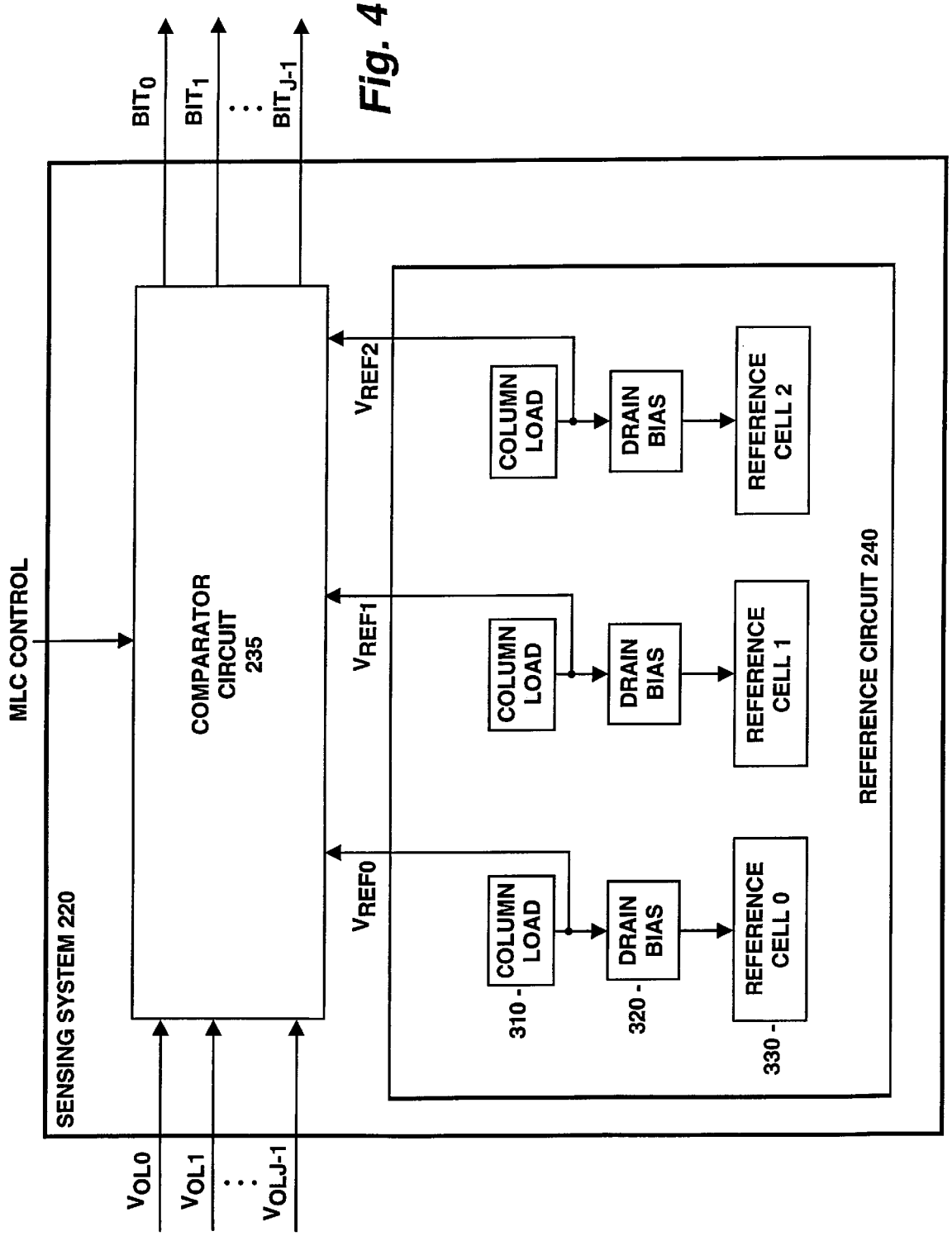
FIG. 4 illustrates a sensing system configured in accordance with one embodiment of the present invention.

FIG. 3 illustrates an array load and memory array configured in accordance with one embodiment of the memory system of the present invention. The memory 150 includes array loads 210, a column decoder 225, a row decoder 230, and memory array 200. The array loads 210 generate, in part, J output line loads or column loads for J selected bit lines in the memory array 200. By generating column loads, the array loads 210 output to the sensing system 220 (FIG. 4) a voltage representing the level of conductivity exhibited by the addressed cells of memory array 200. In one embodiment, sixteen memory cells are accessed for a read operation.

The memory array 200 is arranged as having k words and m columns. The column decoder 225 receives a column address from the program controller 105, and couples the column loads from the array loads 210 to the selected bit lines in memory array 200. The row decoder 230 receives a row address from the program controller 105, and selects the specified word within the memory array 200. The column decoder 225 and row decoder 230 are intended to represent a broad category of decoders used to select bit lines and word lines in memory arrays which are well known in the art and will not be described further.

Each output line in the array loads 210 contains a column load 212 and a drain bias 214. The column load 212 provides a resistance to generate a voltage, $V_{OL}$, in accordance with the conduction of current in a selected memory cell. In one embodiment, the column load 212 is implemented with a metal oxide field effect transistor (FET) operating in the saturated or pinch-off region. The column load is coupled to a source voltage, such as $V_{cc}$. The drain bias 214 biases the corresponding output line to generate the proper drain voltage for the addressed memory cell in the memory array 200. In one embodiment, the drain bias 214 is configured as a cascode circuit. The array loads 210 also contain a select circuit 216 for every two output lines (e.g. each odd and even output line are input to one select circuit 216). The select circuit 216 receives the MLC control signal, program out data, and the MLC addr. In general, the select circuit 216 connects the column loads 212 and drain biases 214 on the output lines to the selected cells in the memory array 200 to support operation of the memory in both the MLC and standard cell modes. The operation of the select circuit 216 is described more fully below.

FIG. 4 illustrates a sensing system configured in accordance with one embodiment of the present invention. The sensing system 220 contains a reference circuit 240 and a comparator circuit 235. The reference circuit 240 generates a plurality of reference voltages ($V_{ref}$). The comparator circuit 235 receives the output line voltages ($V_{OL}$) generated by the addressed cells in the memory array 200, and compares the output line voltages ($V_{OL}$) with the reference voltages ($V_{ref}$) generated from the reference circuit 240. The output of the comparator circuit 235 is the data sensed from the memory system.

The reference circuit 240 generates a plurality of reference voltages ($V_{ref}$) for use in comparison with the output line voltages ($V_{OL}$). Alternatively, if current sensing is utilized, a reference circuit 240 may be configured to generate reference currents. The reference circuit 240 generates "n−1" reference voltages for "n" states or levels stored in the multi-level memory cells. Therefore, in a memory system capable of storing four states to represent 2 bits, the reference circuit 240 generates three voltage levels, $V_{ref0}$, $V_{ref1}$, and $V_{ref2}$.

In order to generate the reference voltage levels, the reference circuit 240 contains a reference cell 330 for each reference voltage. The reference cells are constructed with one-time trimmable EEPROM cells. Each reference cell 330 includes a corresponding column load 310 and drain bias 320. The operation of the column load 310 and the drain bias 320 is analogous with the operation of the column load 212 and drain bias 214 contained in the array loads 210. The reference voltages ($V_{ref}$) are equal to a voltage drop across the column load 310 which is proportional to the conduction of current in the corresponding reference cell 330.

Figure 5:
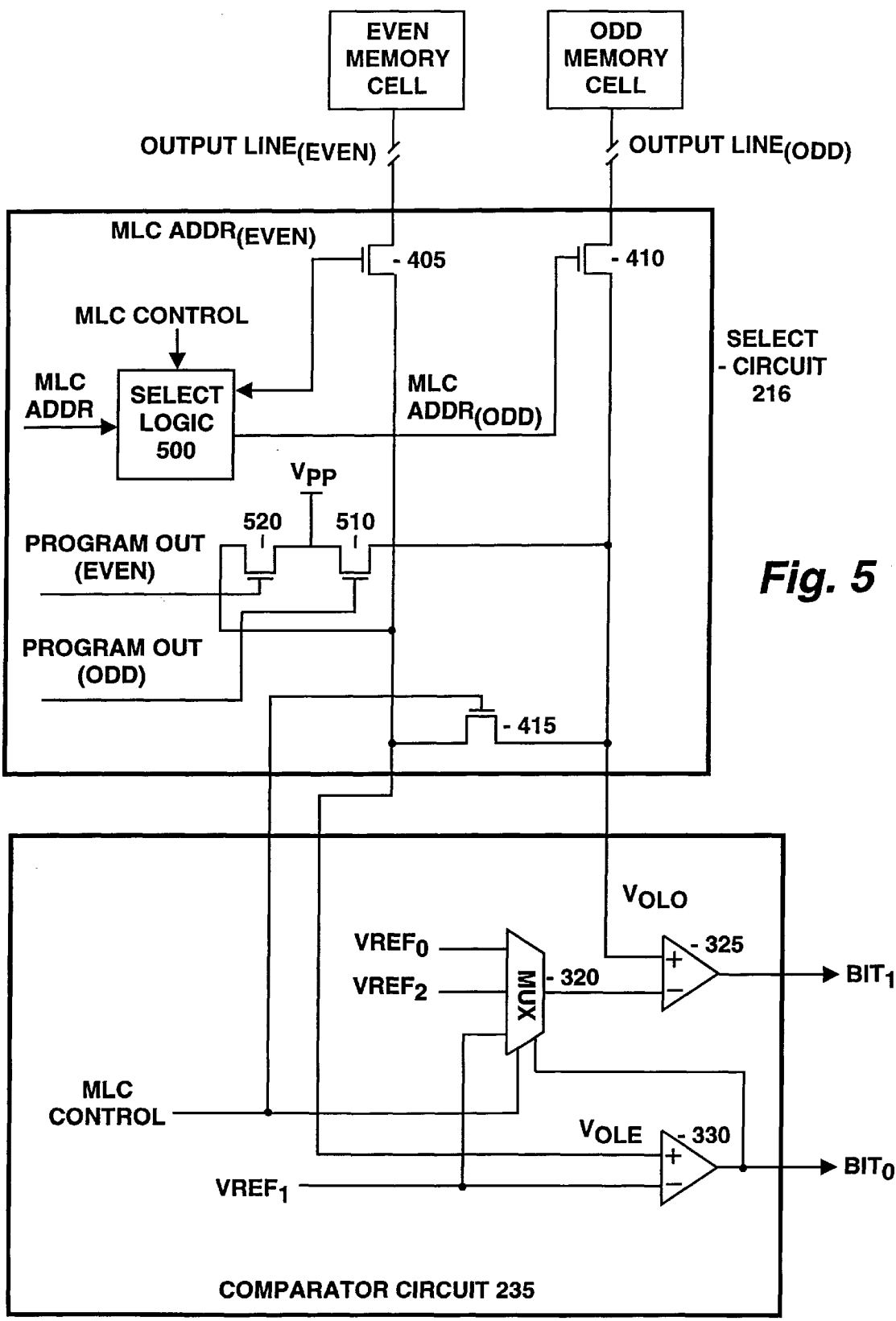
FIG. 5 illustrates a select circuit and a comparator circuit for an odd and even output line configured in accordance with one embodiment of the present invention.

FIG. 5 illustrates the select circuit 216 and the comparator circuit 235 for an odd and even output line configured in accordance with one embodiment of the present invention. As shown in FIG. 5, even and odd output lines are input to the select circuit 216. In order to sense the state of an addressed cell, the select circuit 216 contains a pass transistor for each output line. In one embodiment, the select circuit 216 contains a n-channel field effect transistor (FET) 405 to control conduction of current in the even output line, and a n-channel FET 410 to control conduction of current in the odd output line. The select circuit 216 also contains a pass transistor 415. The transistor 415 couples the odd output line to the even output line, and the gate of transistor 415 is coupled to the MLC control signal.

The select circuit 216 includes select logic 500. The select logic 500 receives as inputs the MLC control and MLC addr signals and generates, as outputs, an $MLC_{(even)}$ signal and an $MLC_{(odd)}$ signal. The $MLC_{(even)}$ signal is coupled to the gate of transistor 405, and the $MLC_{(odd)}$ signal is coupled to the gate of transistor 410. Table 2 illustrates a truth table for the select logic 500.

TABLE 2

| Input | | Output | |
|---|---|---|---|
| MLC ADDR | MLC CONTROL | MLC (even) | MLC (odd) |
| — | 0 | 1 | 1 |
| 0 | 1 | 1 | 0 |
| 1 | 1 | 0 | 1 |

When operating in the MLC mode as indicated by a high logic level on the MLC control signal, the select logic 500 sets the $MLC_{(even)}$ and $MLC_{(odd)}$ signals based on the state of the MLC (e.g. a high logic level selects the odd output line and a low logic level selects the even output line). When operating in the standard cell mode as indicated by a low logic level on the MLC control signal, the select logic 500 sets both the $MLC_{(even)}$ and $MLC_{(odd)}$ signals to a high logic level.

In order to sense an addressed cell in the memory system when operating in the MLC mode, the MLC control signal biases transistor 415 to electrically couple the even output line to the odd output line. The MLC address selects either the even output line or the odd output line, thereby electrically coupling the comparator circuit 235 to the selected odd or even memory cell. When operating in the MLC mode, either the odd or the even memory cell is coupled to both of the odd and even output lines based on the MLC address. In standard cell mode, the MLC control turns off the transistor 415. Consequently, the even memory cell is electrically coupled to the comparator circuit 235 via the even output line, and the odd memory cell is electrically coupled to the comparator circuit 235 via the odd output line.

For every odd and even output lines, the comparator circuit 235 contains two comparators, comparators 325 and 330, and a multiplexor (MUX) 320. The comparator 330 receives, as inputs, the even output line voltage, $V_{OLe}$, and the $V_{ref1}$ voltage reference for comparison. The output of the comparator 330 is designated as $BIT_0$. For a memory array capable of storing four states per memory cell, the MUX 320 receives as inputs the voltage references generated from the reference circuit 240 (e.g. $V_{ref0}$, $V_{ref1}$, and $V_{ref2}$). The MUX 320 outputs a reference voltage $V_{ref0}$, $V_{ref1}$, or $V_{ref2}$, based on the state of the MLC control and the output of comparator 330. The comparator 325 receives, as inputs, the odd output line voltage, $V_{OLo}$, and the selected voltage reference (e.g. $V_{ref0}$, $V_{ref1}$, and $V_{ref2}$) for comparison. The output of the comparator 325 is designated as $BIT_1$.

When operating in the MLC mode, the even output line is coupled to the odd output line (e.g. the $V_{OLe}$ voltage level is equal to the $V_{OLo}$ voltage level). If the $V_{OLe}$ voltage level generated by the selected cell is greater than the $V_{ref1}$ voltage level, then a "1" or high logic level is output from the comparator 330. Alternatively, if the $V_{OLe}$ voltage level is less than the $V_{ref1}$ voltage level, then a "0" or low logic level is output from the comparator 330. The output of the comparator 330 and the MLC control signals are utilized as the select for the MUX 320. If the output of the comparator 330 is a low logic level and the MLC control is active high indicating the memory is operating in the MLC mode, then the $V_{ref0}$ voltage level is selected for comparison with the $V_{OLo}$. If the $V_{OLo}$ voltage level is greater than the $V_{ref0}$ voltage level, then the output of comparator 325 is a high logic level. Alternatively, if the $V_{OLo}$ voltage level is less than the $V_{ref0}$ voltage level, then the output of comparator 325 is a low logic level. If the output of comparator 330 is a high logic level and the MLC control signal is active, then the $V_{ref2}$ voltage level is selected for comparison against the $V_{OLo}$. If the $V_{OLo}$ voltage level is less than the $V_{ref2}$ voltage level, then the output of comparator 325 is a low logic level. Alternatively, if the $V_{OLo}$ voltage level is greater than the $V_{ref2}$ voltage level, then the output of comparator 325 is a high logic level. When operating in the MLC mode, the $BIT_0$ and $BIT_1$ bits represent the state of a single cell.

If the multi-level memory system 102 is operating in the standard cell mode, then the $V_{OLe}$ voltage level on the even output line is generated from the selected even memory cell, and the $V_{OLo}$ voltage level on the odd output line is generated from the selected odd memory cell. An inactive MLC control signal selects the $V_{ref1}$ voltage level at MUX 320 for input to the comparator 325. In this way, the $V_{OLe}$ voltage level is compared against the $V_{ref1}$ voltage level in comparator 330, and the $V_{OLo}$ voltage level is compared against the $V_{ref1}$ voltage level in comparator 325. Therefore, the output of comparator circuit 235 represents two bits, wherein the first bit is read from the selected even memory cell, and the second bit is read from the selected odd memory cell.

In one embodiment, a command architecture for programming and erasing the memory cells is utilized. Programming and erasing also involves verifying that the cells have been properly programmed and erased, respectively. The command state machine 110 is coupled to accept instructions from the microprocessor 100. In general, instructions written into the command state machine 110 provide the necessary commands to generate control signals for erasing and programming the memory as well as verifying the contents after the erase and program operations have been executed. Operating in conjunction with the command state machine 110, the control engine 140 programs the selected memory cells according a "desired data" bit pattern.

In one embodiment, a program sequence includes setting up a program/verify command, loading addresses to the memory 150, and programming the selected memory cells. An erase sequence consists of writing an erase/verify command, and executing the erasure during an erase cycle. In order to verify the erasure, the erase verify operation is executed during a read cycle.

Figure 6:
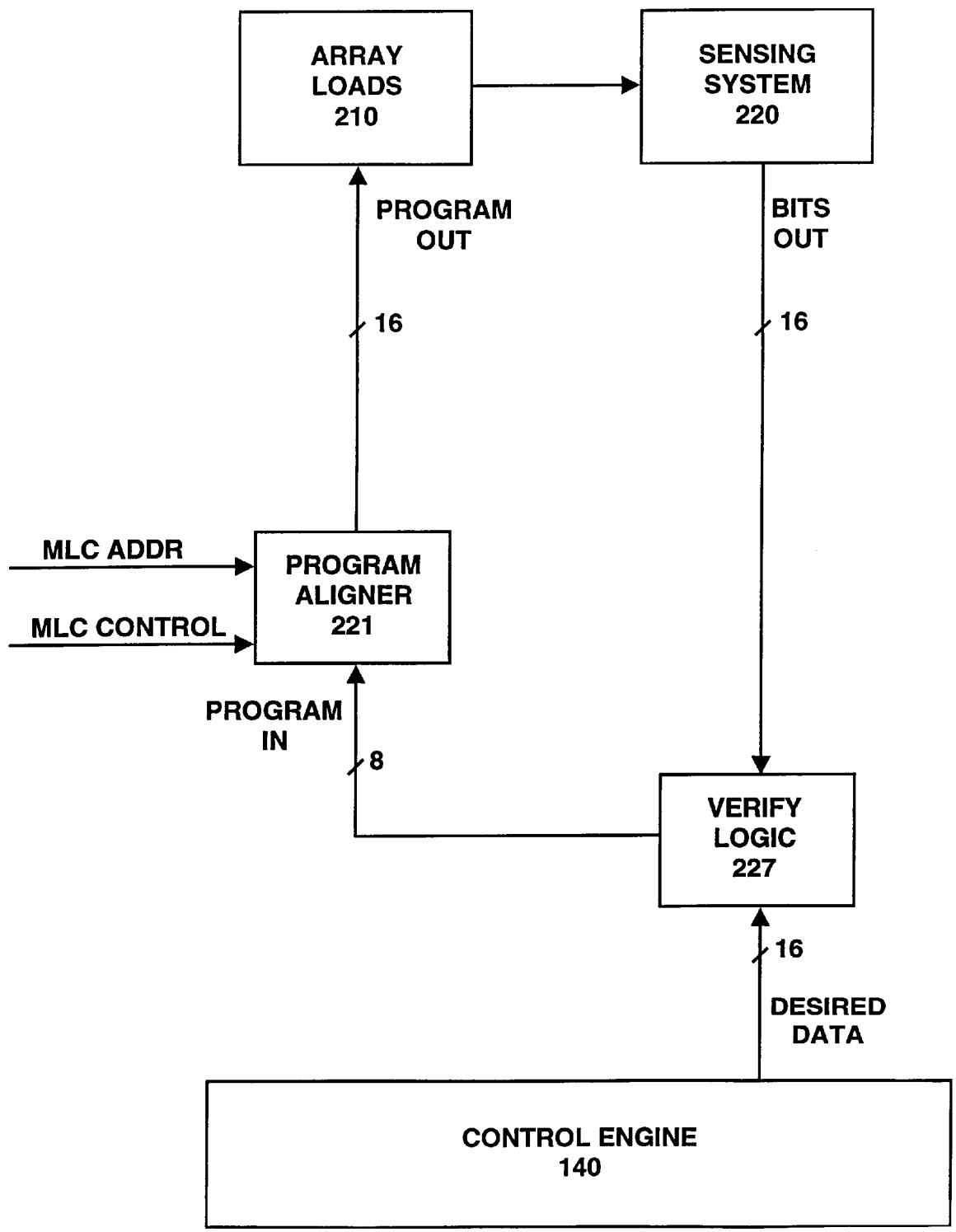
FIG. 6 is a high level block diagram illustrating the program/verify portions of the memory system.

FIG. 6 is a high level block diagram illustrating the program/verify and erase/verify system configured in accordance with one embodiment of the present invention. FIG. 6 illustrates programming of sixteen bits for each wordline. However, any number of memory cells may be used without deviating from the spirit and scope of the invention. In order to program memory cells in the memory array 200, the control engine 140 stores desired data for programming. When operating in the MLC mode, the program aligner 221 selects only a portion of the cells identified by the address for programming.

In operation, verify logic 227 receives sensed data, "bits out", from the sensing system 220, and generates "program in" data to indicate which cells in the memory array 200 require additional programming. For example, for a memory system that senses 16 bits simultaneously, the output of the sensing system 220 is a 16 bit word. When operating in the MLC mode, the verify logic 227 generates 8 bits of "program in" data to identify which cells, that store the 16 bit word, require additional programming. When operating in the standard cell mode, the verify logic 227 generates 16 bits of "program in" data corresponding to the 16 bits selected (not shown). Consequently, when operating in the standard cell mode, the program aligner 221 directly passes the "program in" data as the "program out" data.

In order to select the proper 8 cells for programming in the MLC mode, the programming aligner 221 receives the MLC addr. Based on the MLC addr, the program aligner 221 outputs 16 bits of "program out" data to enable programming of the selected 8 memory cells. As discussed above, when operating in the MLC mode, either the even output lines or the odd output lines are selected. For example, if the even cells are selected, then the program aligner 221 generates program out data that enables only the even output line memory cells that require additional programming.

The verify logic 227 incorporates a compare function. In the standard cell mode, the verify logic 227 performs a single bit comparison to determine whether a memory cell requires programming to the "0" state. In the MLC mode, the compare function involves an analog comparison of the threshold levels stored in the memory cells with the desired digital data. The verify logic 227 compares the desired data with the current data sensed from the sensing system 220, and determines whether the memory cells require additional programming. Table 3 illustrates the analog comparison function for MLC mode operation configured in accordance with the threshold levels disclosed in Table 1. As shown in Table 1, the level 0, the highest level, corresponds to bits "00", and the level 3, the lowest level, corresponds to bits "11". A "1" output indicates that the memory cell requires additional programming. For example, to program bits "00" in a single cell that currently stores bits "10", the verify logic 227 outputs a 1 "program in" data bit. The 1 "program in" data bit indicates that the memory cell requires additional programming to go from level 1 to level 0.

TABLE 3

| "Desired" | "Current" | "Output" |
|---|---|---|
| 00 | 00 | 0 |
| 00 | 01 | 1 |
| 00 | 10 | 1 |
| 00 | 11 | 1 |
| 01 | 00 | 0 |
| 01 | 01 | 0 |
| 01 | 10 | 1 |
| 01 | 11 | 1 |
| 10 | 00 | 0 |
| 10 | 01 | 1 |
| 10 | 10 | 0 |
| 10 | 11 | 1 |
| 11 | 00 | 0 |
| 11 | 01 | 0 |
| 11 | 10 | 0 |
| 11 | 11 | 0 |

Figure 7:
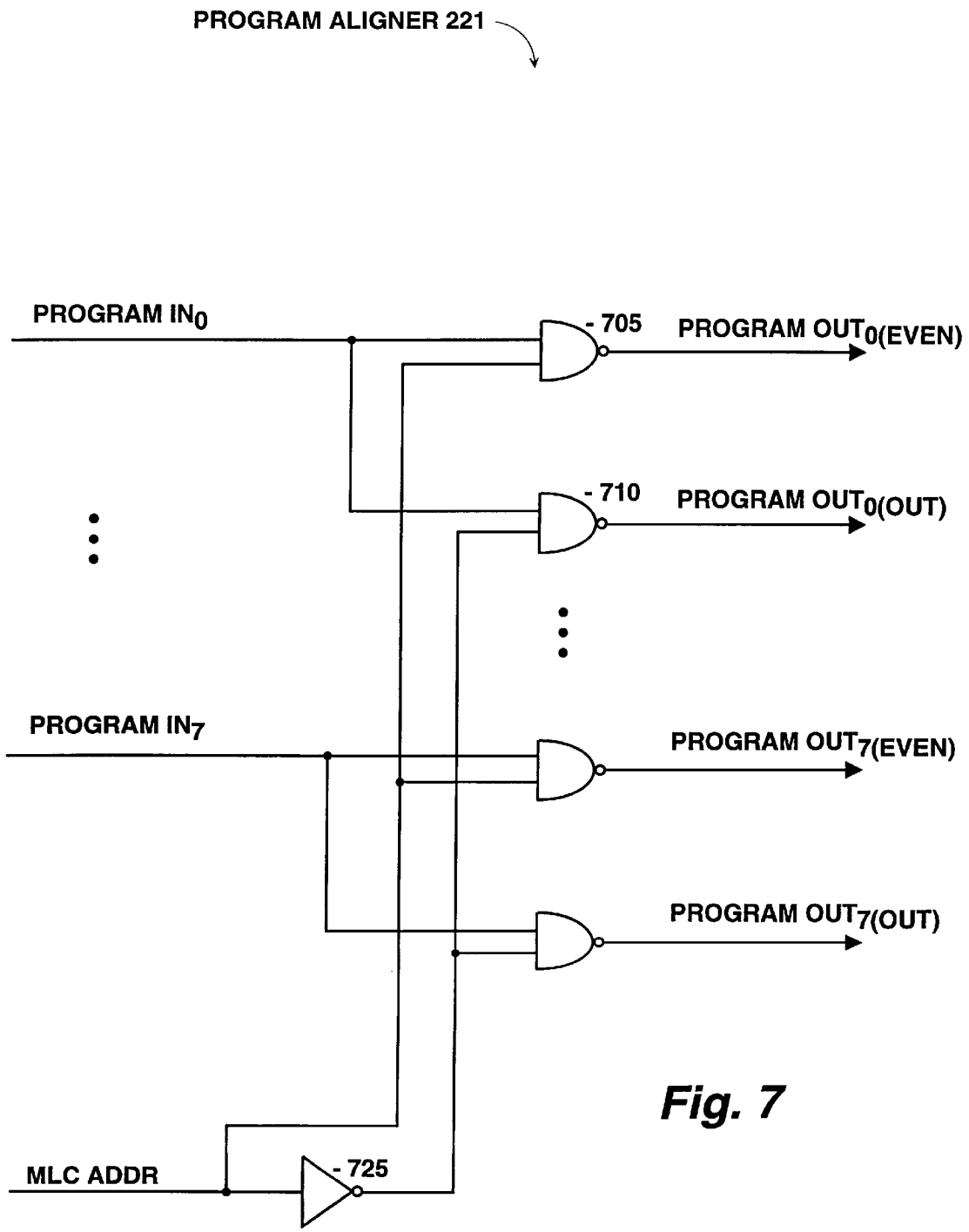
FIG. 7 illustrates a program aligner configured in accordance with a memory system sensing sixteen bits simultaneously.

FIG. 7 illustrates the program aligner 221 configured in accordance with a memory system sensing 16 bits simultaneously. The program aligner 221 receives the 8 "program in" bits from the verify logic 227, and generates the 16 "program out" bits based on the MLC addr. The program aligner 221 contains two NAND gates, 705 and 710, for each "program in" input bit. In addition, the program aligner 221 contains an inverter 725 that receives the MLC addr, and selects the odd or even memory cells. Table 4 illustrates a truth table program aligner circuit 221. A "1" program out indicates that the corresponding output line is enabled for programming.

TABLE 4

| MLC ADDR | Program In | Program Out (even) | Program Out (odd) |
|---|---|---|---|
| 0 | 0 | 0 | 0 |
| 0 | 1 | 1 | 0 |
| 1 | 0 | 0 | 0 |
| 1 | 1 | 0 | 1 |

The "program out" data from the program aligner 221 is input to the select circuit 216 for each pair of output lines in the memory system. As shown in FIG. 5, in order to program the memory cells, each select circuit 216 contains transistors 510 and 520. In one embodiment, the transistors are implemented with n-channel FET devices. The transistor 520 couples the programming voltage, $V_{pp}$, to the even output line, and the transistor 510 couples the programming voltage $V_{pp}$ to the odd output line. The program out$_{(even)}$ signal controls the gate of transistor 520, and the program out$_{(odd)}$ signal controls the gate of transistor 510. In operation, when a high logic level appears on either program out$_{(even)}$ or program out$_{(odd)}$, then the programming voltage $V_{pp}$ is coupled to the corresponding output line permitting additional programming to occur on the selected cell.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A memory system comprising:
   a plurality of memory cells for storing one of a plurality of threshold levels in said memory cells, wherein said threshold levels demarcate $2^n$ number of windows for designating states to represent storage of "n"-bits of data for said memory cells;
   a switch control for permitting selection of an operating mode for said memory system including a multi-level cell mode and a standard cell mode;
   a reading circuit coupled to said switch control and said memory cells for reading a single bit per cell when said switch control indicates selection of said standard cell mode, and for reading multiple bits of data per memory cell when said switch control indicates selection of said multi-level cell mode; and
   a program circuit coupled to said switch control and said memory cells for programming a single bit of data per memory cell when said switch control indicates selection of said standard cell mode, and for programming multiple bits of data per memory cell when said switch control indicates selection of said multi-level cell mode, wherein said program circuit comprises a program aligner coupled to said memory cells and said switch control for selectively programming a first set of memory cells to accommodate storing multiple bits per cell when said switch control indicates selection of said multi-level cell mode, and for selectively programming a second set of addressed memory cells when said switch control indicates selection of said standard cell mode.

2. The memory system as set forth in claim 1, wherein said program circuit comprises verify logic coupled to said reading circuit for comparing said threshold levels stored in addressed memory cells to desired data and for identifying memory cells that require additional programming.

3. The memory system as set forth in claim 1, wherein said memory cells comprise flash electrically erasable programmable read only memory (EEPROM) cells.

4. The memory system as set forth in claim 1, wherein said threshold levels demarcate four windows for designating four states to represent storage of two bits per memory cell.

5. The memory system as set forth in claim 1, wherein said switch control comprises a factory programmable cell for enabling operation of said memory system in said multi-level cell mode.

6. The memory system as set forth in claim 1, wherein said switch control comprises:
   a factory programmable cell for enabling selection of said multi-level cell mode and said standard cell mode; and
   a register for permitting a user, via a command interface, to select between said multi-level cell mode and said standard cell mode.

7. A memory system comprising:
   a plurality of memory cells for storing one of a plurality of threshold levels in said memory cells, wherein said threshold levels demarcate $2^n$ number of windows for designating states to represent storage of "n"-bits of data for said memory cells;
   a switch control for permitting selection of an operating mode for said memory system including a multi-level cell mode and a standard cell mode, wherein said switch control comprises circuitry for enabling said program circuit to select between said multi-level cell mode and said standard cell mode thereby overriding said operating mode selected from said switch control;
   a reading circuit coupled to said switch control and said memory cells for reading a single bit per cell when said switch control indicates selection of said standard cell mode, and for reading multiple bits of data per memory cell when said switch control indicates selection of said multi-level cell mode; and
   a program circuit coupled to said switch control and said memory cells for programming a single bit of data per memory cell when said switch control indicates selection of said standard cell mode, and for programming multiple bits of data per memory cell when said switch control indicates selection of said multi-level cell mode.

8. In a memory device, a method for dynamically switching between a first mode of operation wherein a first number of bits of data is stored by each memory cell of the memory device and a second mode of operation wherein a second number of bits of data is stored by each memory cell, the method comprising the steps of:
   providing a plurality of memory cells and associated circuitry for accessing the memory cells, wherein the associated circuitry is dynamically configurable to discriminate between a number of states that varies in response to a mode of operation such that the first number of bits of data are stored to and read from each memory cell when the memory device is operating in the first mode of operation and the second number of bits of data are stored to and read from each memory cell when the memory device is operating in the second mode of operation;

selecting one of the first and second modes of operation;

reading and storing a single bit per memory cell when the first mode is selected; and reading and storing multiple bits of data per memory cell when the second mode is selected.

9. The method as set forth in claim 8, wherein the step of selecting an operating mode comprises the step of programming a factory programmable cell for enabling operation of said memory system in the second mode.

10. The method as set forth in claim 8, wherein the step of selecting an operating mode comprises the steps of:

programming a factory programmable cell for enabling selection of the first and second modes via a command interface; and permitting a user, via said command interface, to select between the first and second modes.

11. A method for storing data comprising the steps of:

storing one of a plurality of threshold levels in each of a plurality of memory cells, wherein said threshold levels demarcate $2^n$ number of windows for designating states to represent storage of "n"-bits of data for said memory cells;

selecting an operating mode for storing said data including a multi-level cell mode and a standard cell mode, wherein the step of selecting an operating mode comprises the steps of:

programming a factory programmable cell for enabling selection of said multi-level cell mode and said standard cell mode via a command interface;

permitting a user, via said command interface, to select between said multi-level cell mode and said standard cell mode; and enabling selection between said multi-level cell mode and said standard cell mode thereby overriding said operating mode selected from said command interface;

reading a single bit per cell when said standard cell mode is selected; and reading multiple bits of data per memory cell when said multi-level cell mode is selected.

12. A memory system dynamically configurable to operate in a first mode wherein a first number of bits of data is stored in each memory cell and a second mode wherein a second number of bits of data is stored in each memory cell, comprising:

a plurality of memory cells; and circuitry coupled to the plurality of memory cells to access the plurality of memory cells, the circuitry including a switch control that permits dynamic selection between the first and second modes by configuring the circuitry to discriminate between a first number of states when accessing the memory cells while operating in the first mode and a second number of states while operating in the second mode such that the first number of bits of data is stored to and read from each memory cell when operating in the standard cell mode and the second number of bits of data is stored to and read from each memory cell when operating in the multi-level cell mode.

* * * * *

UNITED STATES PATENT AND TRADEMARK OFFICE
CERTIFICATE OF CORRECTION

PATENT NO. : 6,097,637
DATED : August 1, 2000
INVENTOR(S) : Bauer et al.

It is certified that error appears in the above-identified patent and that said Letters Patent is hereby corrected as shown below:

Column 11,
Line 10, after "table" insert -- for the --.

Signed and Sealed this

Thirty-first Day of August, 2004

JON W. DUDAS
*Director of the United States Patent and Trademark Office*